(12) United States Patent
Kobayashi

(10) Patent No.: US 6,995,703 B2
(45) Date of Patent: Feb. 7, 2006

(54) ANALOG-TO-DIGITAL CONVERTING CIRCUIT AND IMAGE PROCESSING CIRCUIT CYCLICALLY REPEATING AD CONVERSION

(75) Inventor: Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/831,270

(22) Filed: Apr. 26, 2004

(65) Prior Publication Data

US 2004/0222910 A1 Nov. 11, 2004

(30) Foreign Application Priority Data

| May 7, 2003 | (JP) | ............................. 2003-129375 |
| Apr. 9, 2004 | (JP) | ............................. 2004-115010 |

(51) Int. Cl.
*H03M 1/12* (2006.01)
*H03M 1/34* (2006.01)

(52) U.S. Cl. ...................................... 341/155; 341/163

(58) Field of Classification Search .............. 341/155, 341/162, 118, 120, 156, 158, 161, 163; 348/207.1, 348/222.1; 386/68
See application file for complete search history.

(56) References Cited

U.S. PATENT DOCUMENTS

| 6,137,533 A | * | 10/2000 | Azim ....................... 348/222.1 |
| 6,166,675 A | * | 12/2000 | Bright ......................... 341/162 |
| 6,259,857 B1 | * | 7/2001 | Miyahara et al. ............. 386/68 |
| 6,720,991 B1 | * | 4/2004 | Choi ........................ 348/207.1 |

FOREIGN PATENT DOCUMENTS

JP 11-145830 5/1999

* cited by examiner

*Primary Examiner*—Patrick Wamsley
(74) *Attorney, Agent, or Firm*—McDermott Will & Emery LLP

(57) ABSTRACT

A first AD converting part of an AD converter converts an input voltage into a digital value of a predetermined number of bits and output the digital value to a digital output circuit and a DA converting part. The DA converting part converts the digital value into an analog value. A subtracting part outputs a difference between the analog value output from the DA converting part and the original input voltage. An amplifying part amplifies the difference output from the subtracting part. An output from the amplifying part is input to the first AD converting part via a feedback path. A subsequent output from the amplifying part is input to the second AD converting part via a branch path so as to produce a digital value of a predetermined number of bits. While the second AD converting part performs conversion, a subsequent input voltage is subjected in parallel to AD conversion by the first AD converting part.

2 Claims, 13 Drawing Sheets

FIG.5

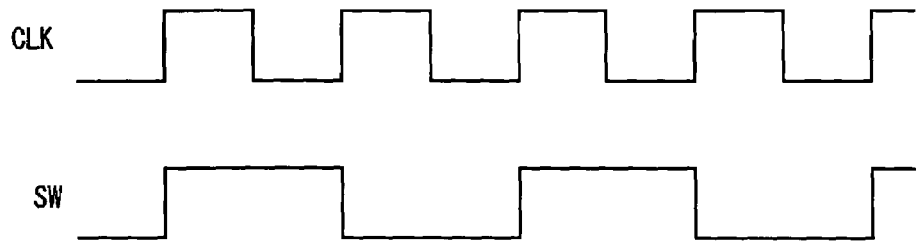

| | | | | | | | | |
|---|---|---|---|---|---|---|---|---|
| SW141 | ON | | OFF | | ON | | OFF | |
| SW142 | OFF | | ON | | OFF | | ON | |
| FIRST AMPLIFYING PART 74 | AZ | AMP | AZ | AMP | AZ | AMP | AZ | AMP |
| SECOND AMPLIFYING PART 78 | AMP | AZ | AMP | AZ | AMP | AZ | AMP | AZ |
| FIRST AD CONVERTING PART 70 | AZ | (1-1) | AZ | (1-2) | AZ | (1-1) | AZ | (1-2) |
| FIRST DA CONVERTING PART 72 | IN OPERATION | UNDEFINED | IN OPERATION | UNDEFINED | IN OPERATION | UNDEFINED | IN OPERATION | UNDEFINED |
| SW144 | OFF | | ON | | OFF | | ON | |
| SW145 | ON | | OFF | | ON | | OFF | |
| THIRD AMPLIFYING PART 84 | AZ | AMP | AZ | AMP | AZ | AMP | AZ | AMP |
| FOURTH AMPLIFYING PART 88 | AMP | AZ | AMP | AZ | AMP | AZ | AMP | AZ |
| SECOND AD CONVERTING PART 80 | AZ | (2-2) | AZ | (2-1) | AZ | (2-2) | AZ | (2-1) |
| SECOND DA CONVERTING PART 82 | IN OPERATION | UNDEFINED | IN OPERATION | UNDEFINED | IN OPERATION | UNDEFINED | IN OPERATION | UNDEFINED |
| SW143 | ON | | OFF | | ON | | OFF | |
| SW146 | OFF | | ON | | OFF | | ON | |
| THIRD AD CONVERTING PART 90 | AZ | (1-3) | AZ | (2-3) | AZ | (1-3) | AZ | (2-3) |
| FIRST CONVERTING UNIT 100 | FIRST CYCLE | | SECOND CYCLE | | FIRST CYCLE | | SECOND CYCLE | |
| SECOND CONVERTING UNIT 102 | SECOND CYCLE | | FIRST CYCLE | | SECOND CYCLE | | FIRST CYCLE | |

ANALOG-TO-DIGITAL CONVERTING CIRCUIT AND IMAGE PROCESSING CIRCUIT CYCLICALLY REPEATING AD CONVERSION

BACKGROUND OF THE INVENTION

1. Field of the Invention

The present invention relates to an analog-to-digital converting circuit and, more particularly, to a technology of cyclic AD converters.

2. Description of the Related Art

In recent years various additional functions such as an image shooting function, an image reconstruction function, a moving image shooting function, a moving image reconstruction function are provided in a portable phone set. As a result of this, there is a growing demand for miniaturization of and power-saving in analog-to-digital converting circuits (hereinafter referred to as "AD converters"). A cyclic AD converter is known as one configuration of AD converters. For example, reference is made to Japanese Laid-Open Patent Application No. 11-145830.

The cyclic AD converter mentioned above is more advantageous than a multi-stage pipeline AD converter in that the circuit area is reduced since the number of components constituting the cyclic AD converter is smaller than that of the multi-stage AD converter. However, reduction in circuit area is normally a trade off for a reduced conversion speed. Therefore, a task to be challenged in a cyclic AD converter is to promote efficiency in configuration and power consumption.

SUMMARY OF THE INVENTION

The present invention is done in these circumstances and has an objective of promote efficiency in processes performed by an AD converter.

In order to achieve the aforementioned objective, an analog-to-digital converting circuit according to one aspect of the present invention comprises: first analog-to-digital converting part for converting an input analog value into a digital value of a predetermined number of bits; a digital-to-analog converting part for converting the digital value output from the analog-to-digital converting part into an analog value; a subtracting part for outputting a difference between the analog value output from the digital-to-analog converting part and the analog value input to the first analog-to-digital converting part; an amplifying part for amplifying an output from the subtracting part; a feedback path for feeding an output from the amplifying part to the first analog-to-digital converting part; a switch for enabling and disabling feedback to the first analog-to-digital converting part on the feedback path; a second analog-to-digital converting part for converting the analog output from the amplifying part into a digital value of a predetermined number of bits; a branch path for causing the output from the amplifying part to branch from the feedback path to the second analog-to-digital converting part; a control part for controlling on/off of the switch. The control part effects control so that a total of (n+1) conversion steps are performed by the first analog-to-digital converting part and the second analog-to-digital converting part in a total of n cycles, by turning on and off the switch at regular intervals.

The analog-to-digital converting circuit is an AD converter which is an improvement over a conventional cyclic AD converter. Particularly of note is that there are provided a plurality of AD converting sub-parts so that the conversion speed is improved. For example, when an input voltage is subject to two conversion cycles, a total of three conversion steps are performed so that the processing speed is increased by 50%. A total of two units of analog-to-digital converting circuits may be provided so that the units share a single second AD converting part. In this case, the second AD converting part may be alternately used by the respective units, by shifting the respective processes in time. The amplifying part may include a sample and hold circuit having an amplification factor of one.

Another embodiment of the present invention is also an analog-to-digital converting circuit. The circuit comprises: a first analog-to-digital converting part for converting an input analog value into a digital value of a predetermined number of bits; a digital-to-analog converting part for converting the digital value output from the analog-to-digital converting part into an analog value; a subtracting part for outputting a difference between the analog value output from the digital-to-analog converting part and the analog value input to the first analog-to-digital converting part; an amplifying part for amplifying an output from the subtracting part; a feedback path for feeding an output from the amplifying part to the first analog-to-digital converting part; a first switch for enabling and disabling feedback to the first analog-to-digital converting part on the feedback path; a second analog-to-digital converting part for converting the analog output from the amplifying part into a digital value of a predetermined number of bits; a branch path for causing the output from the amplifying part to branch from the feedback path to the second analog-to-digital converting part; a second switch for enabling and disabling an input to the second analog-to-digital converting part on the branch path; a control part for controlling on/off of the first and second switches. The control part effects control so that a total of (n+1) conversion steps are performed by the first analog-to-digital converting part and the second analog-to-digital converting part in a total of n cycles, by turning one of the first and second switches on while turning the other off and by switching between on and off of the switches at regular intervals.

The analog-to-digital converting circuit described above is also an analog-to-digital converter which is an improvement over the related-art cyclic AD converter. This aspect of the invention also ensures three conversion steps are performed in two cycles of conversion for a given input voltage so that the speed is improved by 50%. A total of two units of analog-to-digital converting circuits may be provided so that the units share a single second AD converting part. In this case, the second AD converting part may be alternately used by the respective units, by shifting the respective processes in time. The amplifying part may include a sample and hold circuit having an amplification factor of one.

Still another embodiment of the present invention is also an analog-to-digital converting circuit. The circuit comprises: a first analog-to-digital converting part for converting an input analog value into a digital value of a predetermined number of bits; a first digital-to-analog converting part for converting the digital value output from the first analog-to-digital converting part into an analog value; a first subtracting part for outputting a difference between the analog value output from the first digital-to-analog converting part and the analog value input to the first analog-to-digital converting part; a first amplifying part for amplifying an output from the first subtracting part; a second analog-to-digital converting part for converting an analog value output from the first amplifying part into a digital value of a predetermined number of bits; a second digital-to-analog converting part for converting the digital value output from the second analog-to-digital converting part into an analog value; a second subtracting part for outputting a difference between the analog value output from the second digital-to-analog converting part and the analog value input to the second analog-to-digital converting part; a second amplifying part for amplifying an output from the second subtracting part; a first feedback path for feeding an output from the second amplifying part to the first analog-to-digital converting part; a second feedback path for feeding an output of the second amplifying part to the second analog-to-digital converting part; a first switch for enabling and disabling feedback to the first analog-to-digital converting part on the first feedback path; a second switch for enabling and disabling feedback to the second analog-to-digital converting part on the second feedback path; a control part for controlling on/off of the first and second switches. The control part effects control so that conversion steps are performed in parallel by the first analog-to-digital converting part and the second analog-to-digital converting part, by turning one of the first and second switches on while the turning the other off and by switching between on and off of the switches at regular intervals.

The analog-to-digital converting circuit described above is also an analog-to-digital converting circuit which is an improvement over the related-art cyclic AD converter. The conversion speed is improved by providing a plurality of AD converting sub-parts. As a result of the improvement, it is possible to perform four steps of conversion while the circuit goes through two cycles, resulting in an increase of 100% in the processing speed.

Still another embodiment of the present invention is also an analog-to-digital converting circuit. The circuit comprises: an analog-to-digital converting part for converting an input analog value into a digital value of a predetermined number of bits; a digital-to-analog converting part for converting the digital value output from the analog-to-digital converting part into an analog value; a subtracting part for outputting a difference between the analog value output from the digital-to-analog converting part and the analog value input to the analog-to-digital converting part; an amplifying part for amplifying an output from the subtracting part; a feedback path for feeding an output from the amplifying part to the analog-to-digital converting part; a switch provided on a path for supplying a voltage to the amplifying part; a control part for controlling on/off of the switch. The control part halts, by turning the switch off, an operation of the amplifying part during conversion by the analog-to-digital converting part when a predetermined number of cycles has been reached.

The analog-to-digital converting circuit described above is also an analog-to-digital converting circuit which is an improvement over the related-art cyclic AD converter. Particularly of note is that power consumption is reduced by preventing power from being supplied to the components that are temporarily not in operation as the circuit goes through cycles. A voltage may be prevented from being supplied to other components including DA converting parts instead of preventing a voltage from being supplied to an amplifier.

The components described above may be combined in any desired manners. Selected components and implementations thereof may be interchangeably used in different methods, apparatuses and systems.

BRIEF DESCRIPTION OF THE DRAWINGS

FIG. 5 is a time chart showing how the control part according to the second embodiment effects control.

DETAILED DESCRIPTION OF THE INVENTION

First Embodiment

Figure 1:
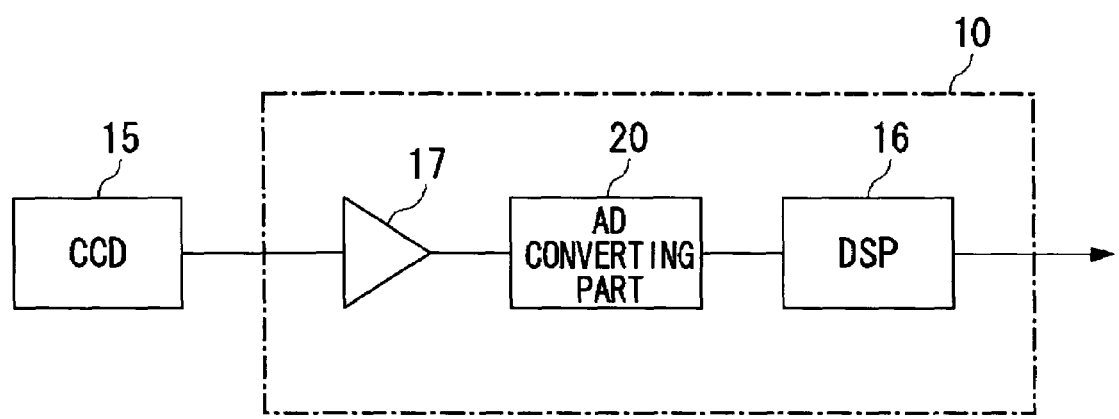
FIG. 1 shows a basic construction of an image processing circuit including an AD converter according to a first embodiment.

FIG. 1 shows a basic construction of an image processing circuit including an AD converter according to the first embodiment. A charge coupled device (CCD) 15 receives light from a subject and converts the light into an electrical signal so as to supply the signal to a one-chip large scale integration (LSI) 10. The one-chip LSI 10 is provided with an auto gain control (AGC) 17, an AD converter 20 and a digital signal processor (DSP) 16. The AGC 17 amplifies the electric signal from the CCD 15. The AD converter 20 converts the amplified analog signal into a digital signal. The DSP 16 subjects the digital signal to compression and the like. The components built in the one-chip LSI 10 are supplied with electric power by a predetermined voltage supply.

The AD converter 20 is a so-called cyclic AD converter and the circuit area thereof is smaller than that of a multi-stage pipeline AD converter. In addition, in comparison with a conventional cyclic AD converter, the speed for processing AD conversion is improved according to the first embodiment.

Figure 2:
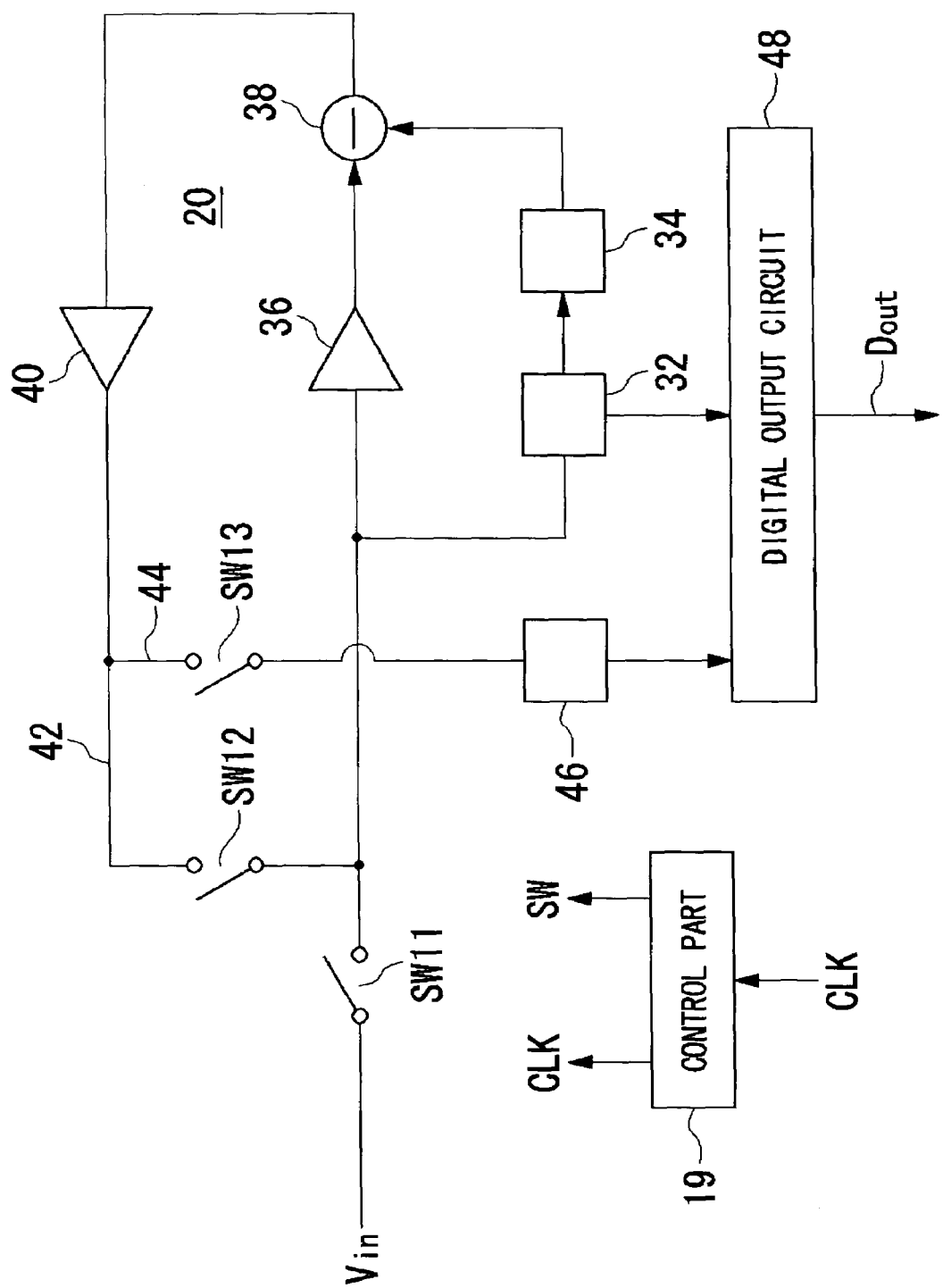
FIG. 2 shows a construction of the AD converter according to the first embodiment.

FIG. 2 shows a construction of an AD converter according to the first embodiment. A first AD converting part 32 converts an analog value of an input voltage into a digital value of a predetermined number of bits and outputs the digital value to a DA converting part 34 and a digital output circuit 48. The DA converting part 34 converts the input digital value into an analog value. A first amplifying part 36 is a sample hold circuit for sampling the input voltage at an amplification factor of two. A subtracting part 38 outputs a difference between the analog value output from the DA converting part 34 and the analog value input to the first AD converting part 32 and sampled by the first amplifying part 36. A second amplifying part 40 amplifies an output of the subtracting part 38 at an amplification factor of four.

A feedback path 42 is a path to feed an output of the second amplifying part 40 to the AD converting part 32, one end of the path being connected to a node between a first switch SW11 and the first AD converting part 32. A second switch SW12 (corresponding to "switch" in claim 1 or "first switch" in claim 4) is provided in the feedback path 42. When turned on, the second switch SW12 feeds the output of the second amplifying part 40 to the first AD converting part 32 and disables feedback when turned off.

A branch path 44 is a path to cause the output of the second amplifying part 40 to branch from the feedback path 42 to the second AD converting part 46. One end of the branch path 44 contiguous with the feedback path 42 is connected to a node between the switch SW12 and the second amplifying part 40. The second AD converting part 46 converts an analog output of the second amplifying part 40 into a digital value of a predetermined number of bits. A third switch SW13 (corresponding to "second switch" in claim 4) is provided in the branch path 44. When turned on, the third switch SW13 feeds the output of the second amplifying part 40 to the second AD converting part 46 and disables the input when turned off. According to the description given above, the third switch SW13 is provided on the branch path 44. Alternatively, the third switch SW13 is not provided on the branch path 44 so that the output of the second amplifying part 40 and the input of the second AD converting part 46 are connected to each other without a switch. In this case, the second AD converting part 46 is maintained in operation irrespective of whether the second switch SW12 is turned on or off. A valid portion of digital data output from the second AD converting part 46 may be supplied to the digital output circuit 48.

A control part 19 generates a clock signal CLK to be supplied to the components including the first AD converting part 32, the DA converting part 34, the first amplifying part 36, the subtracting part 38 and the second amplifying part 40. In addition, the control part 19 generates a switch control signal SW to be supplied to the first switch SW11, the second switch SW12 and the third switch SW13. When turning on one of the second switch SW12 and the third switch SW13, the control part 19 turns off the other, switching between on and off at regular intervals.

The operation according to the construction described above is as follows. First of all, an input voltage Vin is input to the first AD converting part 32 and the first amplifying part 36 when the first switch SW11 is turned on. The first AD converting part 32 converts the input voltage Vin into a digital value of four bits. The converted value is subtracted from the original input voltage Vin by the subtracting part 38. Described above is the operation for the first cycle.

The output of the subtracting part 38 is amplified by the amplifying part 40. At this point of time, the first switch SW11 and the third switch SW13 are turned off, and the second switch SW12 is turned on. The output of the second amplifying part 40 is fed back to the first AD converting part 32 and the first amplifying part 36 via the feedback path 42. The first AD converting part 32 converts an input value into a digital value of three bits. The analog value corresponding to the converted value is subtracted from the input value by the subtracting part 38. Described above is the operation for the second cycle.

The output of the subtracting part 38 is amplified by the amplifying part 40. At this point of time, the second switch SW12 is turned off, and the first switch SW11 and the third switch SW13 are turned on. The analog output of the second amplifying part 40 is input to the second AD converting part 46 via the branch path 44, and the second AD converting part 46 converts the input value into the digital value of three bits. The four-bit digital value, the three-bit digital value and the three-bit digital value produced as a result of stage-by-stage AD conversion are shaped into a ten-bit digital value by the digital output circuit 48 before being output therefrom. In parallel with the conversion by the second AD converting part, the first AD converting part 32 receives a subsequent input voltage Vin and converts the voltage into a four-bit digital value. The operation described in this paragraph is an operation for a third of the three cycles that the first input voltage Vin goes through and a first cycle that the subsequent input voltage Vin goes through. Therefore, a total of three steps of AD conversion are performed while an input goes through two cycles, thus producing a ten-bit digital value. That is, it is ensured that a total of (n+1) steps of AD conversions are performed while a given input goes through n cycles. According to the related-art, only two steps of AD conversion are performed while an input goes through two cycles. According to the first embodiment, however, a total of three steps of AD conversion are performed for the same period. Accordingly, an increase of 50% in the overall operation speed is achieved.

Figure 3:
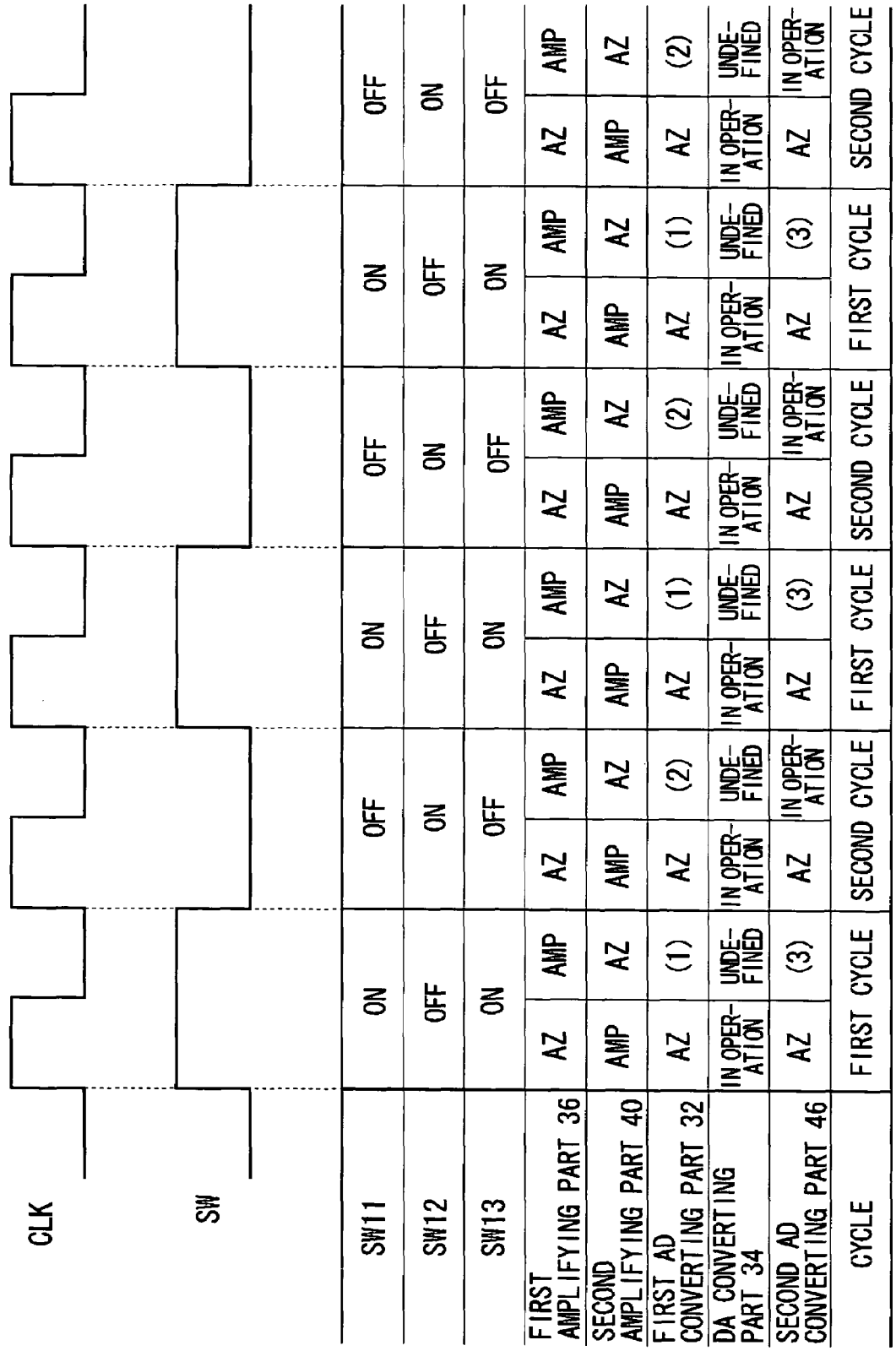
FIG. 3 is a time chart showing how the control part according to the first embodiment effects control.

FIG. 3 is a time chart showing how the control part according to the first embodiment effects control. The cycle of the switch control signal SW is twice as long as that of the clock signal CLK so that a rising edge and a falling edge of the switch control signal are in synchronization with a rising edge of the clock signal CLK. The first switch SW1 and the third switch SW12 are turned on when the switch control signal is high and turned off when the signal is low. The second switch SW12 is turned off when the switch control signal SW is high and turned on when the signal is low.

The first amplifying part 36 performs an auto zero operation when the clock signal CLK is high and performs an amplification operation when the signal is low. The second amplifying part 40 performs an amplification operation when the clock signal is high and performs an auto zero operation when the signal is low. The first AD converting part 32 and the second AD converting part 46 performs an auto zero operation when the clock signal CLK is high and performs AD conversion when the signal is low. The DA converting part 34 performs DA conversion when the clock signal CLK is high and is undefined when the signal is low.

In the first cycle, the first switch SW11 and the third switch SW12 are turned on, and the second switch SW12 is turned off. The input voltage Vin is sampled by the first amplifying part 36 and subjected to AD conversion by the firs AD converting part 32. The conversion described above is a first step of AD conversion producing a digital value including higher four bits constituting the ten bits (indicated by (1) in the figure). In parallel with this, the preceding input voltage is subjected to AD conversion by the second AD converting part 46. The conversion is a third step of AD conversion producing a digital value of three bits constituting the ten bits (indicated by (3) in the figure).

In the second cycle, the first switch SW11 and the third switch SW 13 are turned off, and the switch SW12 is turned on. At this point of time, the output of the subtracting part 38 is amplified by the second amplifying part 40. The output of the second amplifying part 40 is fed back to the first AD converting part 32 and subjected to AD conversion by the first AD converting part 32. The conversion described above is a second step of AD conversion producing a digital value of three bits in the middle of the ten bits (indicated by (2) in the figure). The output of AD conversion is amplified by the second amplifying part 40 and then subjected to a third step of AD conversion by the second AD converting part 46 when the subsequent input voltage Vin goes through the first cycle. The operation for the first and second cycles is repeated at regular intervals.

According to this embodiment, it is possible to increase the overall conversion speed by 50% by introducing an A/D converter circuit such as the second AD converting part 46 into a related-art cyclic AD converter. The second AD converting part 46 may be introduced by putting into use an A/D converting circuit which is connected to the AD converter 20 and which is not in use temporarily.

Second Embodiment

The second embodiment differs from the first embodiment in that there are provided a plurality of cyclic AD converters corresponding to the AD converter 20 of the first embodiment and an AD converting part corresponding to the second AD converting part 46 is shared by the plurality of cyclic AD converters. The description that follows mainly concerns the difference between the first embodiment and the second embodiment.

Figure 4:
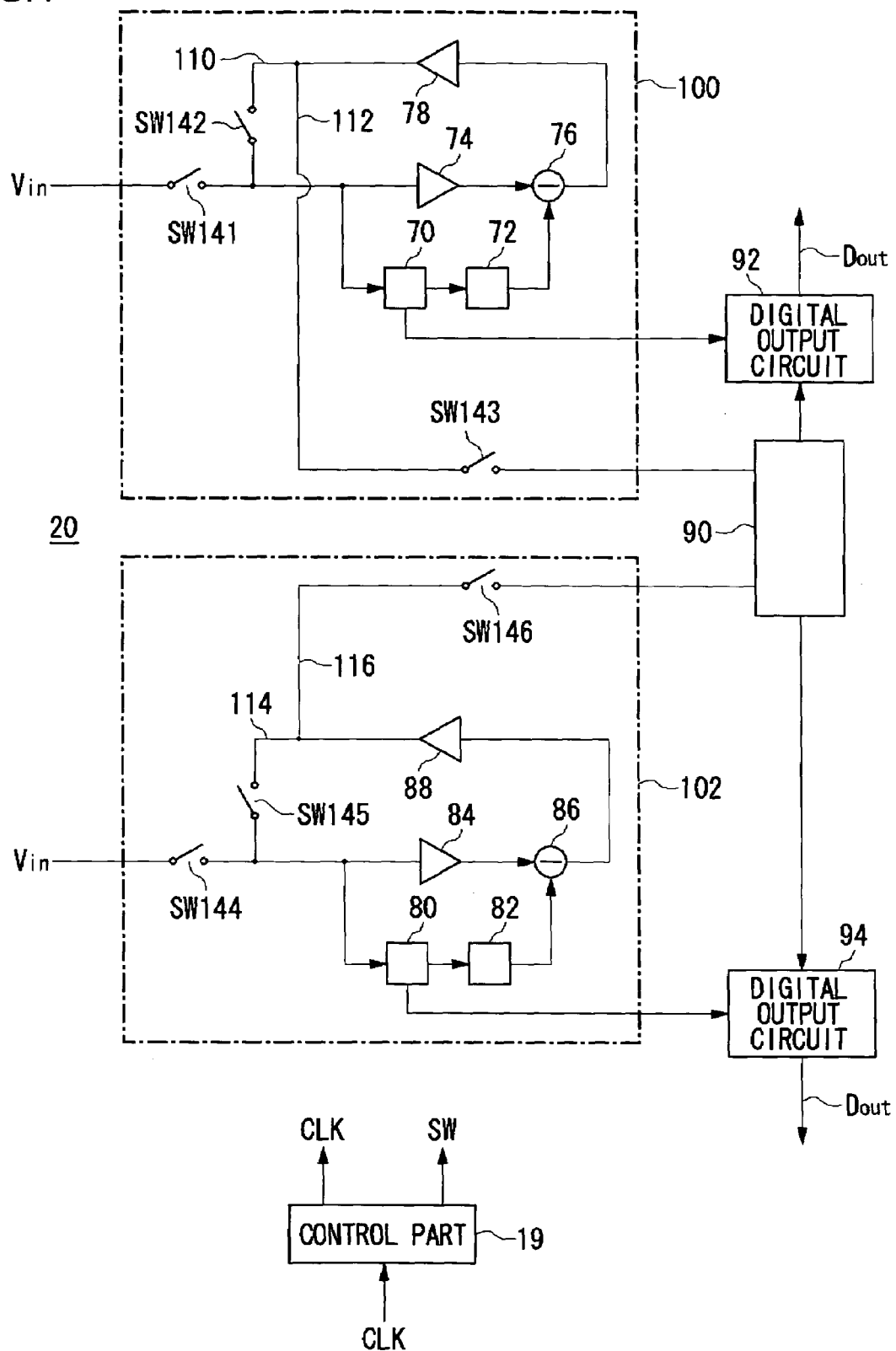
FIG. 4 shows a construction of an AD converter according to a second embodiment.

FIG. 4 shows a construction of an AD converter according to the second embodiment. The AD converter 20 according to the second embodiment is provided with a first converting unit 100 and a second converting unit 102. A first AD converting part 70, a first DA converting part 72, a first amplifying part 74, a first subtracting part 76 and a second amplifying part 78 of the first conversion unit 100 are similarly constructed as the first AD converting part 32, the DA converting part 34, the first amplifying part 36, the subtracting part 38 and the second amplifying part 40 of the first embodiment, respectively. Similarly, a second AD converting part 80, a second DA converting part 82, a third amplifying part 84, a second subtracting part 86 and a fourth amplifying part 88 of the second conversion unit 102 are similarly constructed as the first AD converting part 32, the DA converting part 34, the first amplifying part 36, the subtracting part 38 and the second amplifying part 40 of the first embodiment, respectively. A first switch SW141, a second switch SW142 and a third switch SW143 of the first conversion unit 100 are similarly constructed as the first switch SW11, the second switch SW12 and the third switch SW13 of the first embodiment, respectively. Similarly, a fourth switch SW144, a fifth switch SW145 and a sixth switch SW146 of the second conversion unit 102 are similarly constructed as the first switch SW11, the second switch SW12 and the third switch SW13 of the first embodiment, respectively. The first feedback path 110 and the first branch path 112 of the first conversion unit 100 are similarly constructed as the feedback path 42 and the branch path 44 of the first each embodiment. Similarly, the second feedback path 114 and the second branch path 116 of the second conversion unit 102 are similarly constructed as the feedback path 42 and the branch path 44 of the first each embodiment.

A first digital output circuit 92 and a second digital output circuit 94 are similarly constructed as the digital output circuit 48 of the first embodiment. A third AD converting part 90 and the control part 19 are similarly constructed as the second AD converting part 46 and the control part 19 of the first embodiment, respectively. The third AD converting part 90 is alternately used by the first converting unit 100 and the second converting unit 102. Accordingly, control is effected such that the sixth switch SW146 is turned off while the third switch 143 is turned on, and the sixth switch 146 is turned on when the third switch SW143 is turned off. That is, the control is effected such that the process performed by the first conversion unit 100 and that of the second conversion unit 102 are shifted from each other in time by one cycle.

FIG. 5 is a time chart showing how the control part according to the second embodiment effects control. The sequence of processing steps in the first conversion unit 100 and the second conversion unit 102 are the same as that of the AD converter 20 of the first embodiment. The difference is that the steps are shifted from each other in time by one cycle. More specifically, while the first conversion unit performs a step for the first cycle, the second conversion unit 102 performs a step for the second cycle. Therefore, the third switch SW143 and the sixth switch SW146 are prevented from being turned on simultaneously so that the third AD conversion part 90 can be shared by the first conversion unit 100 and the second conversion unit 102. The cycle and synchronization timing of the clock signal CLK and the switch control signal SW are similar to those of the first embodiment.

The first switch SW141 and the third switch SW143 are turned on when the switch control signal is high and turned off when the signal is low. The second switch SW142 is turned off when the switch control signal SW is high and turned on when the signal is low. The fourth switch SW144 and the sixth switch SW146 are turned off when the switch control signal is high and turned off when the signal is low. The fifth switch SW145 is turned on when the switch control signal SW is high and turned off when the signal is low.

According to this embodiment, it is possible to increase the efficiency with which the components are used, by allowing the first conversion unit 100 and the second conversion unit 102 to share the third AD converting part 90. While the second AD converting part 46 of the first embodiment performs one AD conversion step using two cycles, the third AD converting part 90 is capable of performing one AD conversion step in a cycle. Accordingly, the AD converting part is utilized fully efficiently.

Third Embodiment

The AD converter 20 according to the third embodiment differs from the AD converter 20 of the other embodiments in that there is provided only one AD converting part and the processing speed thereof is variable.

Figure 6:
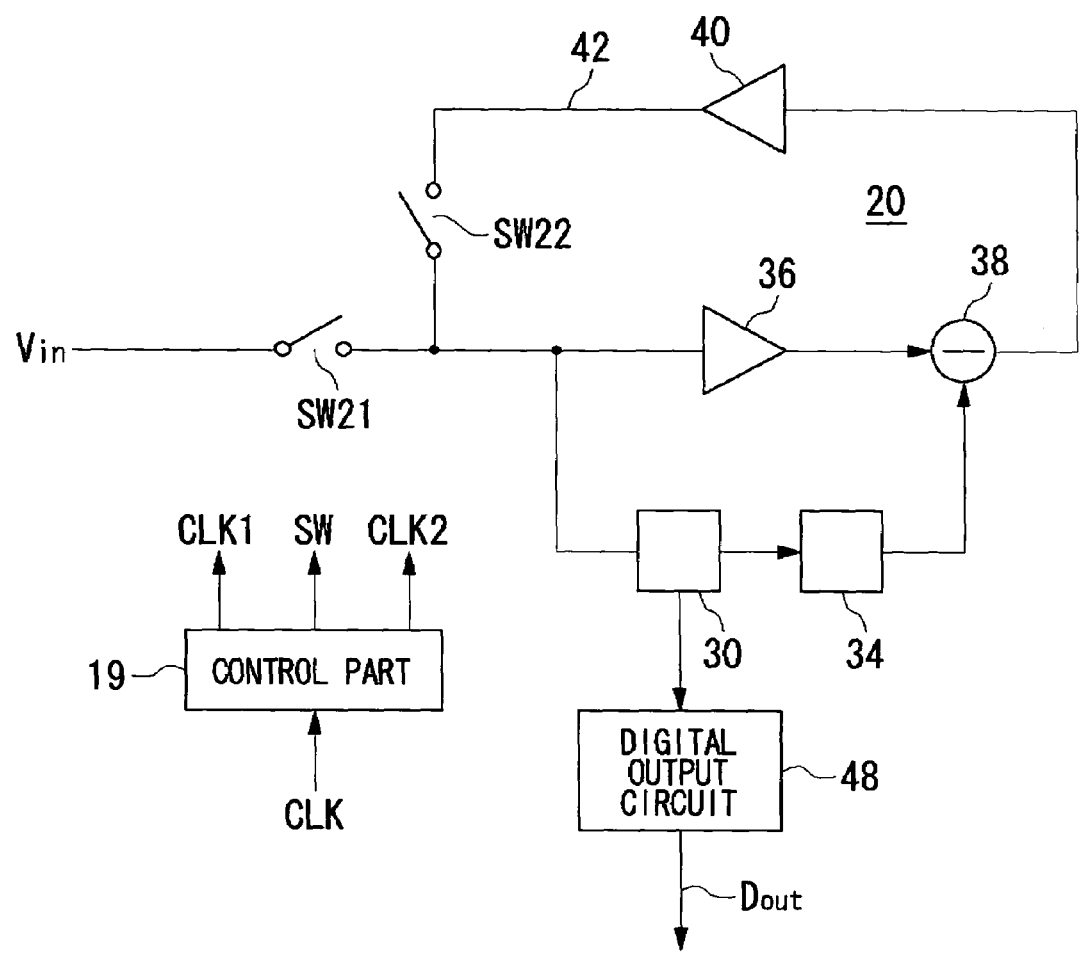
FIG. 6 shows a construction of an AD converter according to a third embodiment.

FIG. 6 shows a construction of an AD converter according to the third embodiment. An AD converting part 30, the DA converting part 34, a first amplifying part 36, the subtracting part 38 and the second amplifying part 40 are similarly constructed as the first AD converting part 32, the DA converting part 34, the first amplifying part 36, the subtracting part 38 and the second amplifying part 40 of the first embodiment, respectively. A first switch SW21, a second switch SW22 (corresponding to "switch" in claim 6), the feedback path 42 and the digital output circuit 48 are similarly constructed as the first switch SW11, the second switch SW12, the feedback path 42 and the digital output circuit 48 of the first embodiment, respectively.

The control part 19 generates the first clock signal CLK to be supplied to the components including the DA converting part 34, the first amplifying unit 36, the subtracting unit 38 and the second amplifying unit 40. In addition, the control part 19 generates a second clock signal CLK2 to be supplied to the DA converting part 34. Furthermore, the control part 19 generates the switch control signal SW to be supplied to the first switch SW21 and the second switch SW22 so as to control on/off of the switches.

The operation according to the construction described above is as follows. First of all, an input voltage Vin is input to the AD converting part 30 and the first amplifying part 36 when the first switch SW21 is turned on. The AD converting part 30 converts the input voltage Vin into a digital value of four bits. The control part 19 then triples the frequency of the second clock signal CLK2. With this, time required for AD conversion attention by the AD converting part 30 becomes ⅓ of time required for AD conversion by the first AD converting part 32 of the first embodiment. When this AD conversion is over, the first switch SW21 is turned off, and the second switch SW22 is turned on. The converted value is subtracted from the original input voltage Vin by the subtracting part 38. Described above is the operation for the first cycle. The frequency of the second clock signal CLK2 is returned to the same frequency as the first clock signal CLK1 when the first cycle is over.

The output of the subtracting part 38 is amplified by the amplifying part 40. The first switch SW21 is remains turned off, and the second switch SW22 remains turned on. The output of the second amplifying part 40 is fed back to the first AD converting part 32 and the first amplifying part 36 via the feedback path 42. The first AD converting part 32 converts the input value into a digital value of three bits. An analog value corresponding to the converted value is subtracted from the input value by the subtracting unit 38. Described above is the operation for the second cycle.

The output of the subtracting part 38 is amplified by the amplifying part 40. Meanwhile, the first switch SW21 is turned on, and the second switch SW22 is turned off. Therefore, a subsequent input voltage Vin is input to the AD converting part 30 and the first amplifying part 36, and the frequency of the second clock signal CLK2 is tripled. When four-bit AD conversion by the AD converting part 30 is over, the first switch SW21 is turned off, and the second switch SW22 is turned on. Therefore, the output of the second amplifying part 40 is input to the AD converting part 30 so that three-bit AD conversion by the AD converting part 30 is carried out. The four-bit digital value, the three-bit digital value and the three-bit digital value produced as a result of stage-by-stage AD conversion are shaped into a ten-bit digital value by the digital output circuit 48 before being output therefrom. The operation described in this paragraph is an operation for a third of the three cycles that the first input voltage Vin goes through and a first cycle that a subsequent input voltage Vin goes through. That is, a total of two steps of AD conversion are performed by the AD converting part 30 in one cycle. Therefore, a total of three steps of AD conversion are performed while an input goes through two cycles, thus producing a ten-bit digital value. To generalize this, it is ensured that a total of (n+1) steps of AD conversions are performed while a given input goes through n cycles. According to the related-art, only two steps of AD conversion are performed while an input goes through two cycles. According to the third embodiment, however, a total of three steps of AD conversion are performed for the same period. Accordingly, an increase of 50% in the overall operation speed is achieved.

Figure 7:
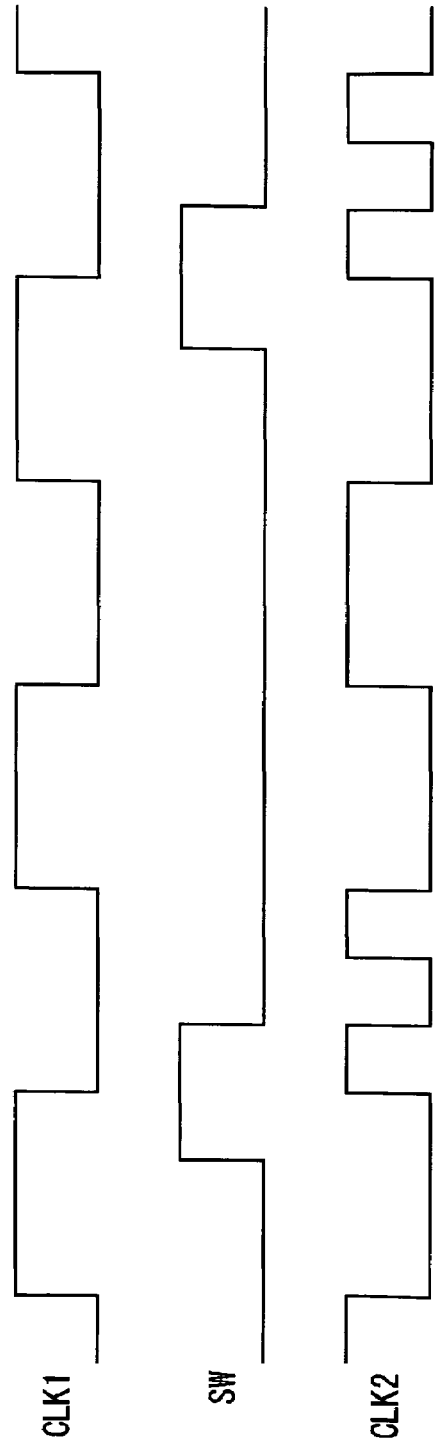
FIG. 7 is a time chart showing how the control part according to the third embodiment effects control.

FIG. 7 is a time chart showing how the control part according to the third embodiment effects control. The cycle of the second clock signal CLK2 is variable. The first cycle is identical in duration to the cycle of the first clock signal CLK1 and the second cycle is ⅓ as long as the cycle of the first clock signal CLK1. Basically, when the first clock signal CLK1 is high, the second clock signal CLK2 is low. When the first clock signal CLK is low, the second clock signal CLK2 is high. Once in two cycles of the first clock signal CLK1, the cycle of the second clock signal CLK2 is shortened to ⅓ of the original cycle while the first clock signal CLK1 is low, thereby causing the second clock signal CLK2 to become high, low and high in the stated order.

The cycle of the switch control signal SW is twice as long as that of the first clock signal CLK1. The period of time in which the switch control signal SW remains high is ⅔ as long as the period of time in which the first clock signal CLK1 remains high. The falling edge of the switch control signal SW is timed to concur with the first falling edge of the second clock signal CLK2 in a period of time in which the cycle thereof is reduced to ⅓ that of the original cycle.

The first switch SW21 is turned on when the switch control signal SW is high and turned off when the signal is low. The second switch SW22 is turned off when the switch control signal SW is high and turned on when the signal is low. The first amplifying part 36 performs an auto zero operation when the clock signal CLK1 is high and performs an amplification operation when the signal is low. The second amplifying part 40 performs an amplification operation at the falling edge of the second clock signal CLK2 and performs an auto zero operation at the rising edge thereof. The first rising edge and the first falling edge of the second clock signal CLK2 occurring in a period of time in which the cycle thereof is reduced to ⅓ that of the original cycle are not supplied to the second amplifying part 40. The AD converting part 30 performs an auto zero operation when the second clock signal CLK2 is low and performs AD conversion when the signal is high. The DA converting part 34 performs DA conversion when the clock signal CLK1 is high and is undefined when the signal is low.

According to the third embodiment, AD conversion that required three cycle conventionally is processed in two cycles, by temporarily increasing the processing speed of the AD converting part 30, thus increasing the conversion speed by 50%.

Fourth Embodiment

The construction according to the fourth embodiment differs from that of the other embodiments in that the number of DA converting parts, amplifying parts and subtracting parts is larger than that of the other embodiments. The speed of AD conversion is twice as large as that of the convention conversion.

Figure 8:
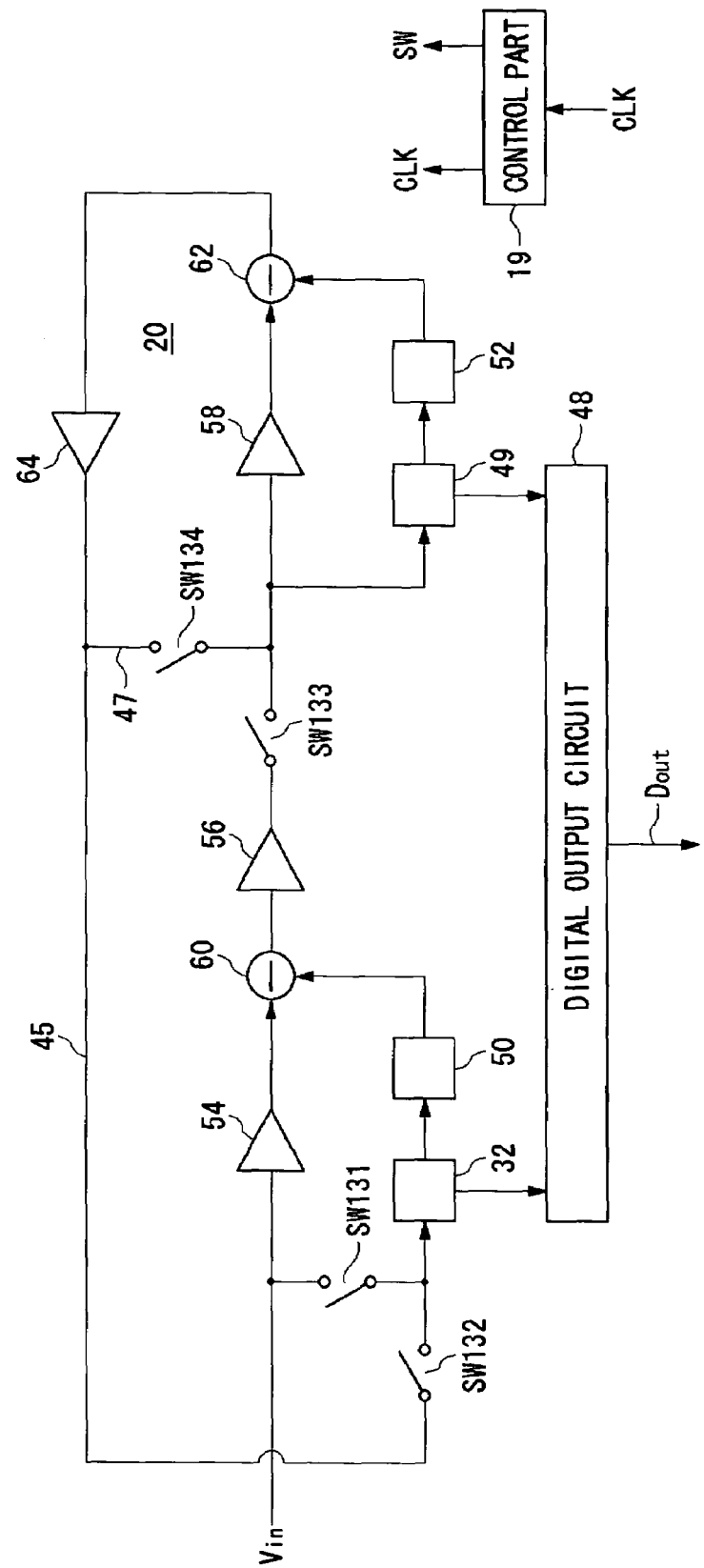
FIG. 8 shows a construction of an AD converter according to a fourth embodiment.

FIG. 8 shows a construction of an AD converter according to the fourth embodiment. The first AD converting part 32, a first DA converting part 50, a first amplifying part 54, a first subtracting part 60 and a second amplifying part 56 are similarly constructed as the first AD converting part 32, the DA converting part 34, the first amplifying part 36, the subtracting part 38 and the second amplifying part 40 of the first embodiment, respectively. The amplification factor of the first amplifying part 54 is one and that of the second amplifying part 56 is two.

A second AD converting part 49, a second DA converting part 52, a third amplifying part 58, a second subtracting part 62 and a fourth amplifying part 64 are similarly constructed as the first AD converting part 32, the DA converting part 34, the first amplifying part 36, the subtracting part 38 and the second amplifying part 40 of the first embodiment, respectively. The amplification factor of the third amplifying part 58 is two and that of the fourth amplifying part 64 is also two.

The control part 19 and the digital output circuit 48 are similarly constructed as the control part 19 and the digital output circuit 48 of the first embodiment. A first switch SW131 and a third switch SW133 are similarly constructed as the first switch SW11 of the first embodiment.

A first feedback path 45, a second feedback path 47, a second switch SW132 (corresponding to "first switch" in claim 7) and a fourth switch SW134 (corresponding to "second switch" in claim 7) are similarly constructed as the first feedback path 42, the branch path 44, the second switch SW12 and the third switch SW13 of the first embodiment. The first feedback path 45 feeds an output from the fourth amplifying part 64 to the first AD converting part 32, and the second feedback path 47 feeds the output from the fourth amplifying part 64 to the second AD converting part 49. The switch SW132 enables and disables feedback to the first AD converting part 32 in the first feedback path 45. The fourth switch SW134 enables and disables feedback to the second AD converting part 49 in the second feedback path 47.

The operation according to the construction described above is as follows. When the first switch SW131 is turned on and the second switch SW132 is turned off, the input voltage Vin is input to the first AD converting part 32 and the first amplifying part 54 via the first switch SW131. AD conversion producing four bits is performed by the first AD converting part 32.

When the first switch SW133 is turned on and the fourth switch SW134 is turned off, an output of the second amplifying part 56 is input to the second AD converting part 49 and the third amplifying part 58 via the third switch SW133. AD conversion producing two bits is performed by the second AD converting part 49.

When the third switch SW133 is turned on, the output of the fourth amplifying part 64 is fed back to the first AD converting part 32 and fed back to the second AD converting part 49 when the fourth switch SW134 is turned on. The control part 19 turns one of the first switch SW131 and the second switch SW132 on and turns off the other. The control part 19 also turns one of the third switch SW133 and the fourth switch SW134 on and turns off the other. When turning on one of the second switch SW132 and the fourth switch SW134, the control unit 19 turns off the other, switching between on and off at regular intervals.

The input voltage Vin is subjected to four-bit AD conversion by the first AD converting part 32 and the two-bit AD conversion by the second AD converting part 49 successively. The input voltage Vin is then fed back to the second AD converting part 49, which performs two-bit AD conversion for a second time. The input voltage Vin is then fed back to the first AD converting part 32, which performs two-bit AD conversion. The four-bit digital value, the two-bit digital value, tow-bit digital value and the two-bit digital value produced as a result of stage-by-stage AD conversion are shaped into a ten-bit digital value by the digital output circuit 48 before being output therefrom.

While the second AD conversion step is being performed by the second AD converting part 49, a subsequent input voltage Vin is input to the first AD converting part 32 so that parallel AD conversion steps are performed. When the output of the fourth amplifying part 64 is subjected to AD conversion by the first AD converting part 32, the second AD converting part 49 subjects a subsequent input voltage Vin to the first AD conversion step in parallel. Therefore, a total of two steps of AD conversion are performed while an input goes through one cycles, thus producing a ten-bit digital value in two cycles. To generalize this, it is ensured that a total of 2n steps of AD conversions are performed while a given input goes through n cycles. According to the related-art, only two steps of AD conversion are performed while an input goes through two cycles. According to the fourth embodiment, however, a total of four steps of AD conversion are performed for the same period. Accordingly, an increase of 100% in the overall operation speed is achieved.

In comparison with the related-art cyclic AD converter, components including the first converting part 32, the first DA converting part 50, the first amplifying part 54 and the second amplifying part 56 are introduced in the fourth embodiment. These components may be introduced by putting into use circuits which are connected to the AD converter 20 and which are not in use temporarily.

Figure 9:
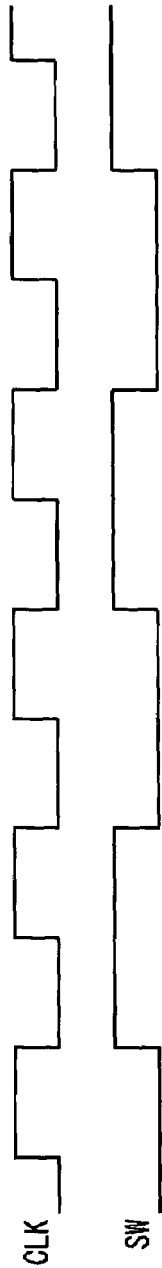
FIG. 9 is a time chart showing how the control part according to the fourth embodiment effects control.

FIG. 9 is a time chart showing how the control part according to the fourth embodiment effects control. The cycle of the switch control signal SW is twice as long as that of the clock signal CLK so that the rising edge and the falling edge of the switch control signal is in synchronization with the falling edge of the clock signal CLK. The second switch SW131 is turned off when the switch control signal SW is high and turned on when the signal is low. The second switch SW132 is turned on when the switch control signal SW is high and turned off when the signal is low. The first amplifying part 54 performs an amplification operation at the rising edge of the clock signal CLK and performs an auto zero operation or a sampling operation at a next rising edge thereof. These operations are repeated at each rising edge of the clock signal CLK. The second amplifying part 56 performs an amplification operation, an auto zero operation or a sampling operation at each rising edge of the clock signal CLK. However, there is a shift in time of one cycle between the operation of the first amplifying part 54 and that of the second amplifying part 56.

The first amplifying part 32 performs AD conversion when the clock signal is high and performs an auto zero operation when the signal is low. The first DA converting part 50 performs DA conversion when the clock signal CLK rises and turns undefined at a next rising edge. DA conversion is performed in parallel while the first amplifying part 54 performs an auto zero operation or a sampling operation.

The third switch SW133 is turned off when the switch control signal SW is low and turned on when the signal is high. The fourth switch SW134 is turned on when the switch control signal SW is low and turned off when the signal is high. The third amplifying part 58 performs an amplification operation when the clock signal CLK is high and performs an auto zero operation when the signal is low. The fourth amplifying part 64 performs an auto zero operation when the clock signal CLK is high and the performs an amplification operation when the signal is low. The second AD converting part 49 performs AD conversion when the clock signal CLK is high and performs an auto zero operation when the signal is low. The second DA converting part 52 performs DA conversion when the clock signal CLK is low and is undefined when the signal is high.

According to the fourth embodiment, the overall conversion speed is increased by 100%, by introducing components including the first converting part 32, the first DA converting part 50, the first amplifying part 54, the second amplifying part 56 and the first subtracting part 60 into the related-art cyclic AD converter.

Fifth Embodiment

Figure 10:
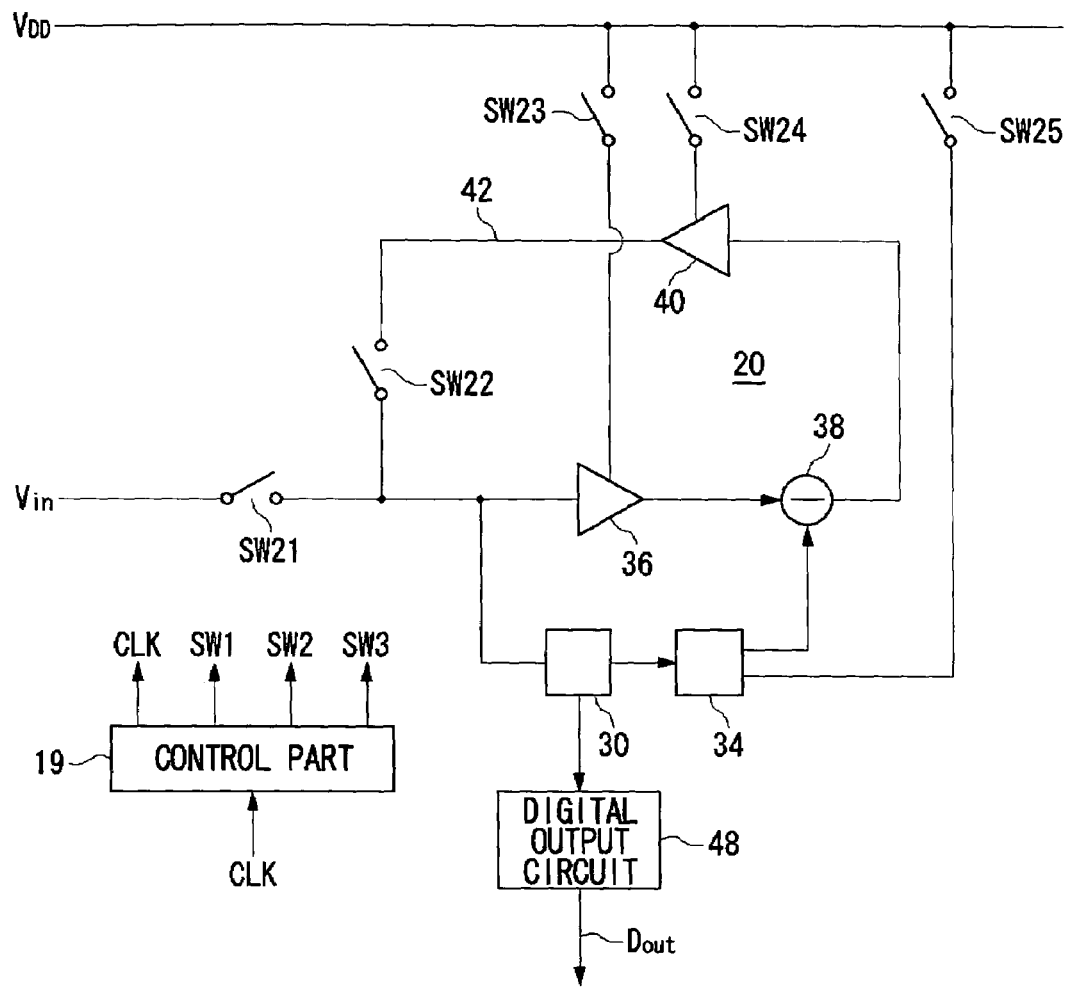
FIG. 10 shows a construction of an AD converter according to a fifth embodiment.

FIG. 10 shows a construction of an AD converter according to the fifth embodiment. The fifth embodiment differs from the other embodiments in that a voltage supplied to an amplifying part is controlled. The AD converting part 30, the DA converting part 34, the first amplifying part 36, the subtracting part 38 and the second amplifying part 40 are similarly constructed as the first AD converting part 30, the DA converting part 34, the first amplifying part 36, the subtracting part 38 and the second amplifying part 40 of the third embodiment, respectively. The first switch SW21, the second switch SW22 and the digital output circuit 48 are similarly constructed as the first switch SW21, the second switch SW22, and the digital output circuit 48 of the third embodiment, respectively.

A power supply voltage VDD is supplied to the first amplifying part 36 when the third switch SW23 is turned on and prevented from being supplied thereto when the third switch SW23 is turned off. A power supply voltage VDD is supplied to the second amplifying part 40 when the fourth switch SW24 is turned on and prevented from being supplied thereto when the fourth switch SW24 is turned off. A power supply voltage VDD is supplied to the DA converting part 34 when the fifth switch SW25 is turned on and prevented from being supplied thereto when the fifth switch SW25 is turned off. The control unit 19 generates the clock signal CLK to be supplied to the components including the AD converting part 32, the DA converting unit 34, the first amplifying unit 36, the subtracting unit 38 and the second amplifying unit 40. The control part 19 generates the first switch control signal SW to be supplied to the first switch SW21 and the second switch SW22 so as to control on/off of the switches. The control part 19 supplies the second switch control signal SW to the third switch SW23 and supplies the third switch control signal SW3 to the fourth switch SW24 so as to control on/off of the switches. When turning on one of the first switch SW21 and the second switch SW22, the control unit 19 turns off the other, switching between on and of at regular intervals.

Figure 11:
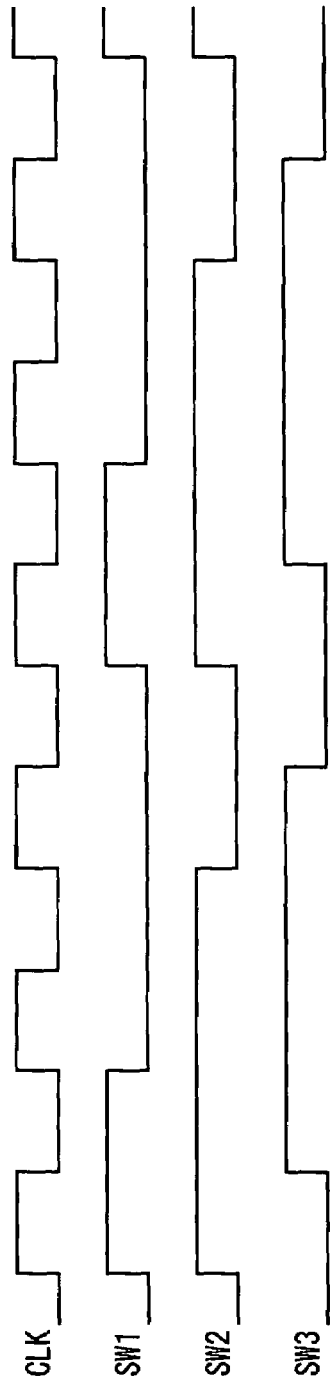
FIG. 11 is a time chart showing how the control part according to the fifth embodiment effects control.

FIG. 11 is a time chart showing how the control part according to the fifth embodiment effects control. The cycle of the first switch control signal SW1 is three times as long as that of the clock signal CLK, remaining high for a period of time corresponding to one cycle of the clock signal CLK and remaining low for a period of time corresponding to two cycles thereof. The rising edge and the falling edge of the first switch control signal SW1 are in synchronization with the rising edge of the clock signal CLK. The cycle of the second switch control signal SW2 and the third switch control signal SW3 is also three times as long as that of the clock signal CLK, remaining high for a period of time corresponding to two cycles of the clock signal CLK, and remaining low for a period of time corresponding to one cycle thereof. The rising edge and the falling edge of the second switch control signal SW2 are in synchronization with the rising edge of the clock signal CLK. The rising edge and the falling edge of the third switch control signal SW3 are in synchronization with the falling edge of the clock signal CLK.

The first switch SW21 is turned on when the first switch control signal SW1 is high and turned off when the signal is low. The second switch SW22 is turned off when the first switch control signal SW is high and turned on when the signal is low. The first switch SW23 is turned on when the second switch control signal SW2 is high and turned off when the signal is low. The fourth switch SW24 and the fifth switch SW25 are turned on when the third switch control signal SW1 is high and turned off when the signal is low.

The first amplifying part 36 performs an auto zero operation when the clock signal CLK is high and performs an amplification operation when the signal is low. When the second switch control signal SW2 is low, i.e. when the third switch SW23 is turned off, the operation is temporarily halted. The second amplifying part 40 performs an amplification operation when the clock signal CLK is high and performs an auto zero operation when the signal is low. When the third switch control signal SW3 is low, i.e. when the fourth switch SW24 is turned off, the operation is temporarily halted.

The AD converting part 30 performs an auto zero operation when the clock signal CLK is high and performs AD conversion when the signal is low. The DA converting part 34 performs DA conversion when the clock signal CLK is high and is undefined when the signal is low. When the third switch control signal SW3 is low, i.e. when the fifth switch SW25 is turned off, the operation is temporarily halted. The third switch SW23, the fourth switch SW24 and the fifth switch SW25 are turned off during AD conversion, when the third cycle is reached. The switches are turned off because there is no need for feedback and amplification of a result of AD conversion in the third cycle.

According to the fifth embodiment, power consumption is reduced by preventing a voltage from being supplied to an amplifying part when the operation of the amplifying part is no longer necessary.

Sixth Embodiment

Figure 12:
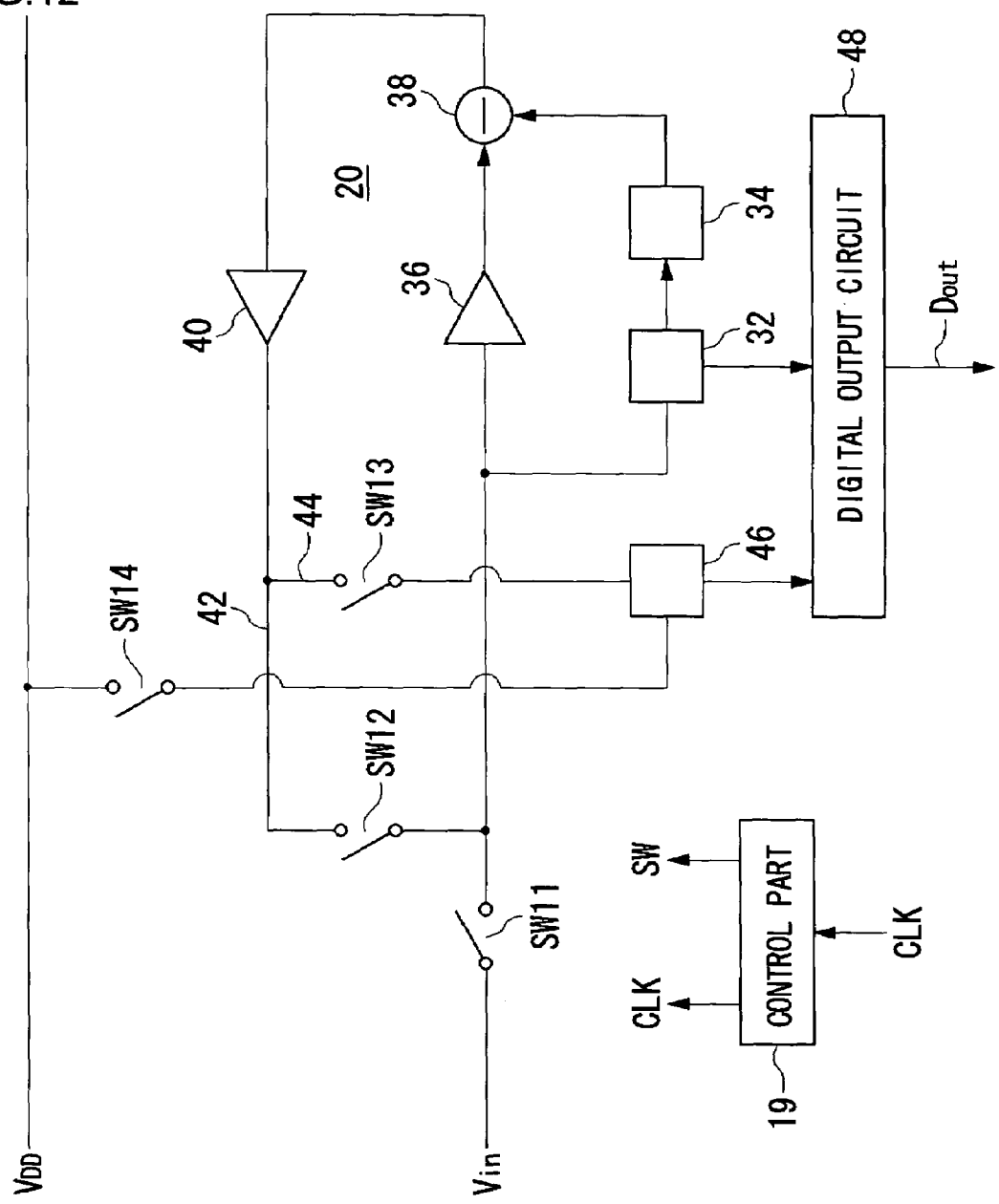
FIG. 12 shows a construction of an AD converter according to a sixth embodiment.

FIG. 12 shows a construction of an AD converter according to the sixth embodiment. The sixth embodiment differs from the other embodiments in that a voltage supplied to an AD converting part is controlled. The first AD converting part 32, the DA converting part 34, the first amplifying part 36, the subtracting part 38, the second amplifying part 40 and the second AD converting part 46 are similarly constructed as the first AD converting part 32, the DA converting part 34, the first amplifying part 36, the subtracting part 38, the second amplifying part 40 and the second AD converting part of the first embodiment, respectively. The first switch SW11, the second switch SW12, the third switch SW13, the control part 19 and the digital output circuit 48 are similarly constructed as the first switch SW11, the second switch SW12, the third switch SW13, the control part 19 and the digital output circuit 48 of the first embodiment, respectively.

A power supply voltage VDD is supplied to the second AD converting part 46 when the fourth switch SW14 is turned on and prevented from being supplied thereto when the fourth switch SW14 is turned off. The control unit 19 supplies the clock signal CLK to the components including the first AD converting unit 32, the DA converting unit 34, the first amplifying unit 36, the subtracting unit 38 and the second AD converting part 46. The control part 19 supplies the switch control signal SW to the first switch SW11, the second switch SW13, the third switch SW13 and the fourth switch SW14 so as to control on/off of the switches. It is ensured that the first switch SW11 and the third switch SW13 are turned on or off simultaneously. When turning on the first switch SW11 and the third switch SW13, the control part 19 turns off the second switch SW12, and turns on the first switch SW12 when it turns off the first switch SW11 and the third switch SW13.

Figure 13:
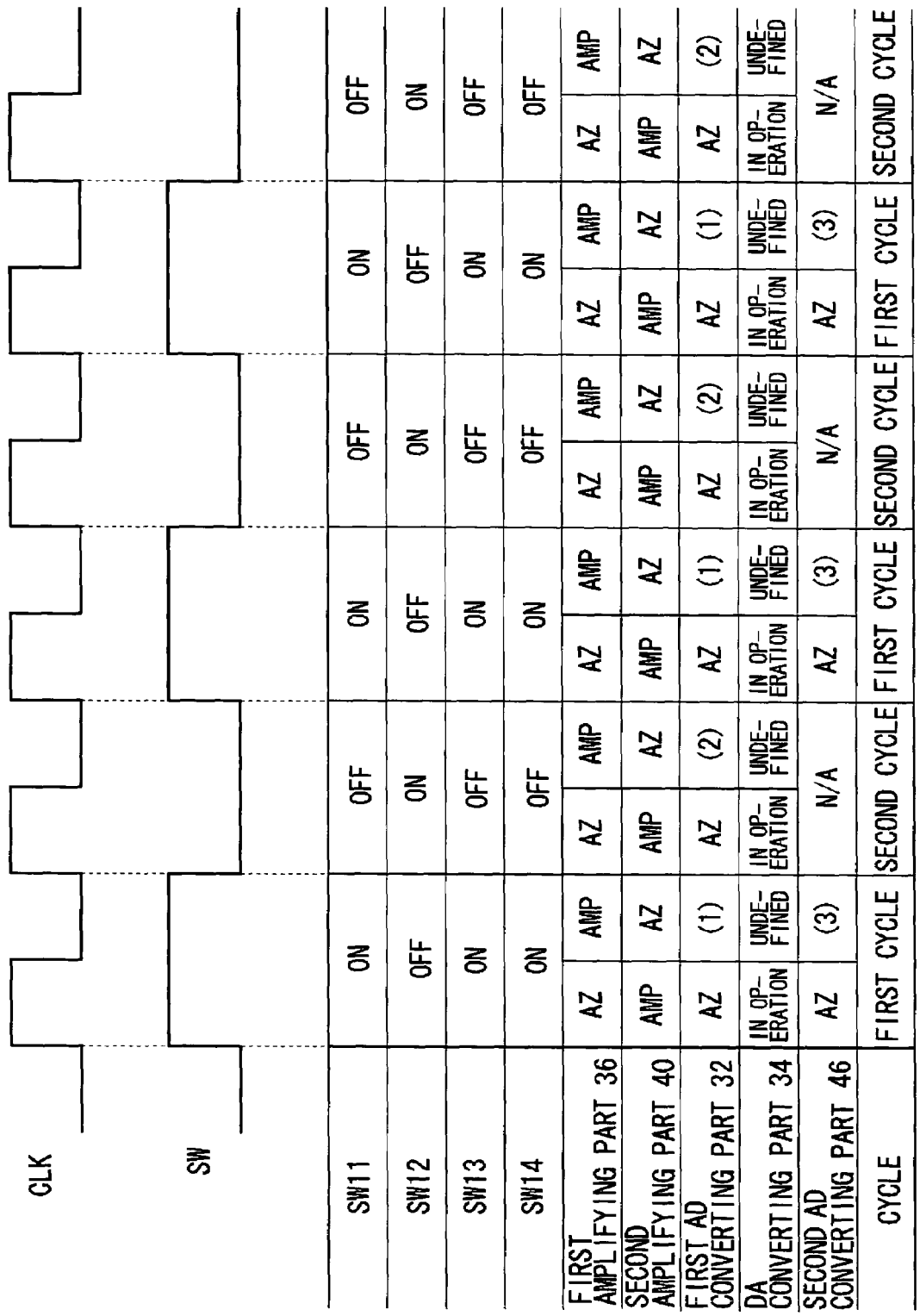
FIG. 13 is a time chart showing how the control part according to the sixth embodiment effects control.

FIG. 13 is a time chart showing how the control part according to the sixth embodiment effects control. The cycle and synchronization timing of the clock signal CLK and the switch control signal SW are the same as those of the first embodiment. The first switch SW11, the third switch SW13 and the fourth switch SW14 are turned on when the switch control signal is high and turned off when the signal is low. The second switch SW12 is turned off when the switch control signal SW is high and turned on when the signal is low.

The first amplifying part 36 performs an auto zero operation when the clock signal CLK is high and performs an amplification operation when the signal is low. The second amplifying part 40 performs an amplification operation when the clock signal CLK is high and performs an auto zero operation when the signal is low. The first AD converting part 32 performs an auto zero operation when the clock signal CLK is high and performs AD conversion when the signal is low. The DA converting part 34 performs DA conversion when the clock signal CLK is high and is undefined when the signal is low.

The second AD converting part 46 performs an auto zero operation when the clock signal CLK is high and performs AD conversion when the signal is low. When the switch control signal SW is low, i.e. when the fourth switch SW14 is turned off, the voltage is prevented from being supplied so that the operation is temporarily halted. The fourth switch SW is turned off during AD conversion in the first cycle. During that period of time, the second AD converting part 46 need not perform AD conversion. According to the sixth embodiment, power consumption is reduced by preventing a voltage from being supplied to the DA converting part when the operation of the DA converting part is not necessary.

The invention has been explained by describing the embodiments. Those skilled in the art will readily appreciate that the embodiments are illustrative and various variations in combinations of components and processes that are within the scope of the present invention are possible. Some variations will now be described.

In the embodiments described, the subtracting part and the amplifying part are provided separately. In one variation, these may be integrally constructed in the form of a subtracting/amplifying part. The digital output circuit 48 described in the embodiments may be constructed as a part of the DSP 16 of FIG. 1 according to a variation.

In the fifth embodiment, the voltage supplied to the first amplifying part 36, the second amplifying part 40 and the DA converting part 34 is controlled. In a variation, the voltage supplied to only one or two of the first amplifying part 36, the second amplifying part 40 and the DA converting part 34 may be controlled.

In the sixth embodiment, the voltage supplied to the second AD converting part 46 is controlled. In a variation, the voltage supplied to the DA converting part 34 is additionally controlled. Such a construction also helps reduce power consumption.

What is claimed is:

1. An analog-to-digital converting circuit comprising:
a first analog-to-digital converting part for converting an input analog value into a digital value of a predetermined number of bits;
a first digital-to-analog converting part for converting the digital value output from said first analog-to-digital converting part into an analog value;
a first subtracting part for outputting a difference between the analog value output from said first digital-to-analog converting part and the analog value input to said first analog-to-digital converting part;
a first amplifying part for amplifying an output from said first subtracting part;
a second analog-to-digital converting part for converting an analog value output from said first amplifying part into a digital value of a predetermined number of bits;
a second digital-to-analog converting part for converting the digital value output from said second analog-to-digital converting part into an analog value;
a second amplifying part for sampling an output from said first amplifying part and amplifying the sampled output;
a second subtracting part for outputting a difference between the analog value output from said second digital-to-analog converting part and the analog value output from said second amplifying part;
a third amplifying part for amplifying an output from said second subtracting part;
a first feedback path for feeding an output from said third amplifying part to said first analog-to-digital converting part;
a second feedback path for feeding an output of said third amplifying part to said second analog-to-digital converting part;
a first switch for enabling and disabling feedback to said first analog-to-digital converting part on said first feedback path;
a second switch for enabling and disabling feedback to said second analog-to-digital converting part on said second feedback path;
a control part for controlling on/off of said first and second switches,
wherein said control part effects control so that conversion steps are performed in parallel by said first analog-to-digital converting part and said second analog-to-digital converting part, by turning one of said first and second switches on while the turning the other off and by switching between on and off of said switches at regular intervals.

2. An image processing circuit comprising:
a charge coupled device for receiving light from a subject and converting the light into an electrical signal; an automatic gain controller for amplifying the electrical signal;
an analog-to-digital converter for converting the amplified electrical signal into a digital signal;
a digital signal processor for subjecting the digital signal to image processing,
wherein said analog-to-digital converter comprises:
a first analog-to-digital converting part for converting an input analog value into a digital value of a predetermined number of bits;
a first digital-to-analog converting part for converting the digital value output from said first analog-to-digital converting part into an analog value;
a first subtracting part for outputting a difference between the analog value output from said first digital-to-analog converting part and the analog value input to said first analog-to-digital converting part;
a first amplifying part for amplifying an output from said first subtracting part;
a second analog-to-digital converting part for converting an analog value output from said first amplifying part into a digital value of a predetermined number of bits;
a second digital-to-analog converting part for converting the digital value output from said second analog-to-digital converting part into an analog value;
a second amplifying part for sampling an output from said first amplifying part and amplifying the sampled output;
a second subtracting part for outputting a difference between the analog value output from said second digital-to-analog converting part and the analog value output from said second amplifying part;
a third amplifying part for amplifying an output from said second subtracting part;

a first feedback path for feeding an output from said third amplifying part to said first analog-to-digital converting part;

a second feedback path for feeding an output of said third amplifying part to said second analog-to-digital converting part;

a first switch for enabling and disabling feedback to said first analog-to-digital converting part on said first feedback path;

a second switch for enabling and disabling feedback to said second analog-to-digital converting part on said second feedback path;

a control part for controlling on/off of said first and second switches, wherein said control part effects control so that conversion steps are performed in parallel by said first analog-to-digital converting part and said second analog-to-digital converting part, by turning one of said first and second switches on while the turning the other off and by switching between on and off of said switches at regular intervals.

* * * * *